United States Patent
Tanaka et al.

(10) Patent No.: US 6,210,260 B1
(45) Date of Patent: Apr. 3, 2001

(54) CARRIER AND CMP APPARATUS

(75) Inventors: Hideo Tanaka; Xu-Jin Wang; Misuo Sugiyama; Kei Tanaka; Makoto Ishida; Shunji Hakomori, all of Ayase (JP)

(73) Assignee: SpeedFam Co., Ltd., Tokyo (JP)

( * ) Notice: Subject to any disclaimer, the term of this patent is extended or adjusted under 35 U.S.C. 154(b) by 0 days.

(21) Appl. No.: 09/260,335

(22) Filed: Mar. 1, 1999

(30) Foreign Application Priority Data

Apr. 2, 1998 (JP) .................................................. 10-107032

(51) Int. Cl.⁷ ...................................................... B24B 5/00
(52) U.S. Cl. ........................... 451/289; 451/288; 451/390
(58) Field of Search ..................................... 451/285, 289, 451/388, 390

(56) References Cited

U.S. PATENT DOCUMENTS

| 5,205,082 | | 4/1993 | Shendon et al. |
| 5,423,558 | * | 6/1995 | Koeth et al. ........................... 451/289 |
| 5,423,716 | * | 6/1995 | Strasbaugh ........................... 451/289 |
| 5,449,216 | * | 9/1995 | Strasbaugh ........................... 451/388 |
| 5,527,209 | * | 6/1996 | Volodarsky et al. .................. 451/388 |
| 5,733,182 | * | 3/1998 | Muramatsu et al. .................. 451/289 |
| 5,795,215 | * | 8/1998 | Guthrie et al. ........................ 451/289 |
| 5,851,140 | * | 12/1998 | Barns et al. .......................... 451/289 |
| 5,916,015 | * | 6/1999 | Natalicio ............................... 451/388 |
| 5,957,751 | * | 9/1999 | Govzman et al. .................... 451/289 |
| 6,024,630 | * | 2/2000 | Shendon et al. ..................... 451/289 |
| 6,036,587 | * | 3/2000 | Tolles et al. .......................... 451/388 |

FOREIGN PATENT DOCUMENTS

| 6-79618 | 3/1994 | (JP) . |
| 7-112364 | 5/1995 | (JP) . |

* cited by examiner

Primary Examiner—M. Rachuba
(74) Attorney, Agent, or Firm—Burr & Brown

(57) ABSTRACT

A carrier comprising a disk-shaped body portion having fluid circulation holes, a ring-shaped diaphragm portion expanding outward from the outer peripheral surface of the body portion and having pliability, a ring-shaped edge portion projecting at least downward from an outer edge portion of the diaphragm portion and having an inner diameter of at least an outer diameter of a work piece, a pliable sheet having an outer peripheral portion affixed air tightly to a bottom end portion of said edge portion, the back surface of the sheet defining a single pressure chamber communicating with the fluid circulation holes, and a ring-shaped member surrounding the work piece affixed to the bottom surface of the sheet.

5 Claims, 12 Drawing Sheets

CARRIER AND CMP APPARATUS

BACKGROUND OF THE INVENTION

1. Field of the Invention

The present invention relates to a carrier and a chemical mechanical polishing (CMP) apparatus for uniformly polishing the surface of a rotating wafer or other workpiece while pressing the workpiece against a polishing pad of a platen.

2. Description of the Related Art

FIG. 15 is a sectional view of a carrier of a general CMP apparatus.

As shown in FIG. 15, a CMP apparatus is provided with a carrier 100 and with a platen 110 to which a polishing pad 111 is attached. By making the carrier 100 and the platen 110 rotate by a rotating mechanism while supplying a polishing solution in a state with the wafer W pressed against the platen 110 side by a carrier base 101 of the carrier 100, the surface of the wafer W is polished by the polishing pad 111.

Further, this CMP apparatus polishes the wafer W by the back side reference polishing system. Thus, a backing pad 102 is attached to the carrier base 101 and the surface of the wafer W is polished with the backing pad 102 in contact with the back surface of the wafer W.

Even if the sectional shapes of the backing pad 102 and the polishing pad 111 are uniform, there is sometimes warping or undulations in the wafer W itself. As opposed to this, the CMP apparatus shown in FIG. 15 is not structured to deal with such warping or undulations in the wafer W, so it is not possible to uniformly press the surface of the wafer W as a whole.

Therefore, the carrier of the CMP apparatus of the air pressurizing system shown in FIG. 16 has been devised.

A carrier 300, as shown in the figure, provides a ring-shaped projecting portion 302 at the outer peripheral portion of the bottom surface of a carrier base 301. By using a double-sided adhesive tape 304 to attach a backing pad 307 to the bottom surface of the projecting portion 302, a pressure chamber 306 is defined.

In this configuration, air arriving through air holes in the carrier base 301 is introduced into the pressure chamber 306 to uniformly press the wafer W through the backing pad 307 by the air pressure in the pressure chamber 306.

The above CMP apparatus of the related art, however, suffered from the following problems.

In the carrier 300 of the CMP apparatus according to the above related art, it is possible to press the entire surface of the wafer W by a uniform air pressure, but there was a large range of over polishing at the outer peripheral portion of the wafer W and the yield was remarkably poor.

FIG. 17 is an enlarged sectional view of the state of over polishing.

As shown in FIG. 17, this carrier 300 is structured with the wafer W covered by the backing pad 307 adhered to the projecting portion 302 of the carrier base 301, so if a downward pressing force is applied to the carrier 300 during the polishing work, the outer peripheral portion of the backing pad 307 will be pulled downward by the projecting portion 302.

Therefore, a tension T occurs at the outer peripheral portion of the backing pad 307 and a pressure of the vertical component T1 of the tension T is applied to the outer peripheral portion of the wafer W in addition to the air pressure P.

As a result, the polishing rate of the outer peripheral portion of the wafer W becomes remarkably larger than the polishing rate of the other portions, the range of over polishing L becomes as larger as 10 mm to 20 mm, and the yield of the wafer W ends up becoming remarkably poor.

SUMMARY OF THE INVENTION

The present invention was made so as to solve the above problems and has as its object to provide a carrier and CMP apparatus which make uniform the distribution of pressure applied to the surface of the workpiece, including the outer peripheral portion, and improve the uniformity of polish of the entire surface of the workpiece.

Therefore, and according to a preferred embodiment of the presnt invention, there is provided a carrier comprising: a disk-shaped body portion having fluid circulation holes; a ring-shaped diaphragm portion expanding outward from the outer peripheral surface of the body portion and having pliability; a ring-shaped edge portion projecting at least downward from an outer edge portion of the diaphragm portion and having an inner diameter of at least an outer diameter of a workpiece; a pliable sheet having an outer peripheral portion affixed air-tightly to a bottom end portion of the edge portion and defining a pressure chamber communicating with the fluid circulation holes; and a ring-shaped member surrounding the workpiece affixed to the bottom surface of the sheet.

In this configuration, if the body portion is pressed in a state where the workpiece on the platen is held by the ring-shaped member of the carrier, the sheet contacts substantially the entire surface, essentially molding itself to the warping etc. of the workpiece. If fluid of a predetermined pressure is supplied from the fluid circulation holes of the body portion in this state, the fluid will pass through the fluid circulation holes of the body portion and fill the pressure chamber and substantially the entire surface of the workpiece will receive a uniform fluid pressure through the sheet.

If the body portion of the carrier is pressed, however, the downward pressing force will be transmitted to the edge portion as well and the edge portion will act to pull the outer peripheral portion of the sheet downward. Since the edge portion is connected to the body portion through the pliable diaphragm portion, however, the pliable diaphragm portion will flex and the pressing force applied to the edge portion will be relieved. Therefore, no downward tension will occur at the outer peripheral portion of the sheet and the distribution of pressure of the fluid acting on the entire surface of the workpiece will become uniform.

Further, since the workpiece is surrounded by the ring-shaped member, the workpiece will not jump outside when the carrier is rotating.

For a sheet, it is possible to use various types of pliable sheets. According to a preferred embodiment of the invention, the sheet is formed by a single hard or soft sheet and the outer peripheral portion of the upper surface of the hard or soft sheet is affixed air-tightly to the bottom surface of the edge portion by an insoluble adhesive or soluble adhesive.

Further, according to another embodiment of the invention, a soft sheet is adhered to the bottom surface of a hard sheet.

Further, according to yet another embodiment of the invention, the hard and the soft sheets are adhered through an intermediate sheet having an adhesive on its upper and lower surfaces.

If a fluid is supplied inside the rotating air-tight pressure chamber, however, the fluid pressure at the outer peripheral portion of the pressure chamber may differ from the fluid pressure at other portions. Therefore, according to another embodiment of the invention, the edge portion is provided with through holes communicating the pressure chamber and the outer portion.

In this configuration, the fluid flowing from the fluid circulation holes into the pressure chamber flows out from the through holes to the outside, the flow of the fluid in the pressure chamber is stabilized, and the uniformity of distribution of pressure is further improved.

Further, according to another embodiment of the invention, the diaphragm portion at locations near the edge portion is provided with holes communicating the pressure chamber and an outer portion.

CMP apparatuses using the carrier also stand as aspects of the invention in their own right. Therefore, according to another embodiment of the invention, there is provided a CMP apparatus provided with a platen to the surface of which a polishing pad is attached, a carrier capable of rotating in a state where the workpiece on the polishing pad of the platen is held, a fluid supply means capable of supplying fluid of a desired pressure to the carrier, and a rotary drive means for rotating the carrier while pressing against it, wherein the carrier is comprised of a disk-shaped body portion having fluid circulation holes through which a fluid supplied from the fluid supply means can enter and exit; a ring-shaped diaphragm portion expanding outward from the outer peripheral surface of the body portion and having pliability; a ring-shaped edge portion projecting at least downward from an outer edge portion of the diaphragm portion and having an inner diameter of at least an outer diameter of a workpiece; a pliable sheet having an outer peripheral portion affixed air-tightly to a bottom end portion of the edge portion and defining a pressure chamber communicating with the fluid circulation holes; and a ring-shaped member surrounding the workpiece affixed to the bottom surface of the sheet.

Further, according to another embodiment of the invention, the edge portion of the carrier is provided with through holes communicating the pressure chamber and the outer portion.

Further, according to yet another embodiment of the invention, the diaphragm portion at a location near the edge portion is provided with holes communicating the pressure chamber and an outer portion.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Preferred embodiments of the present invention will be explained below with reference to the drawings.

(First Embodiment)

Figure 1:
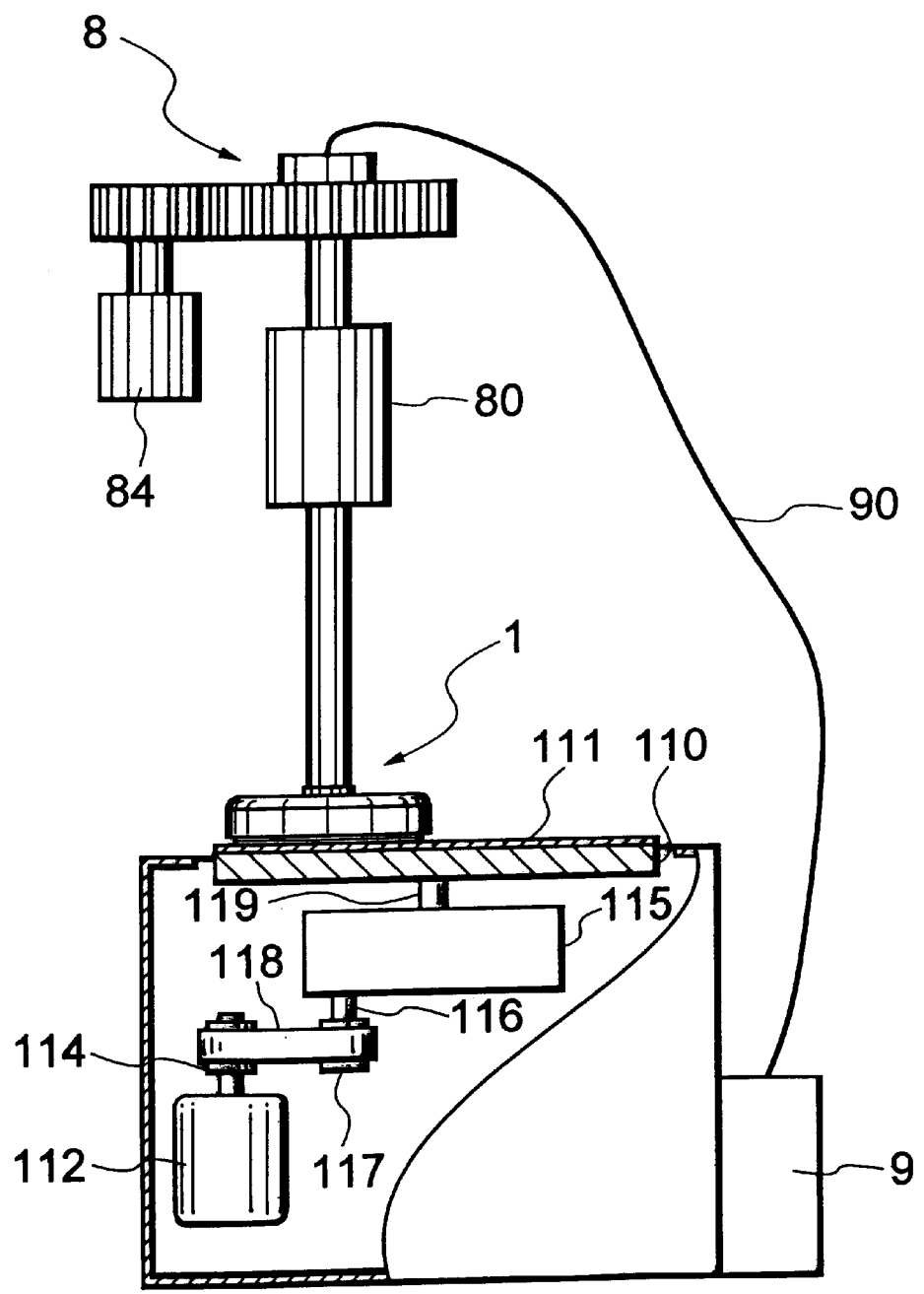
FIG. 1 is a partial cutaway front view of a CMP apparatus according to a first embodiment of the present invention.

FIG. 1 is a partially cutaway front view of a CMP apparatus according to a first embodiment of the present invention.

As shown in FIG. 1, this CMP apparatus is provided with a platen 110 having a polishing pad 111 attached to its surface, a carrier 1, a rotary drive mechanism 8 serving as the rotary drive means, and an air pump 9 serving as a fluid supply means.

The platen 110 is designed to be driven to rotate by a main motor 112 inside the apparatus housing.

That is, a belt 118 is wound around a pulley 114 attached to the main motor 112 and a pulley 117 attached to an input shaft 116 of a transmission 115. The platen 110 is attached to an output shaft 119 of the transmission 115.

Due to this, the rotation of the main motor 112 is transmitted to the pulley 117, the rotation of the pulley 117 is converted in speed by the transmission 115 and transmitted to the output shaft 119, and the platen 110 is rotated at a predetermined speed.

The rotary drive mechanism 8 is a mechanism for making the carrier 1 rotate while pressing against it and is provided with a cylinder 80 and a motor 84.

Figure 2:
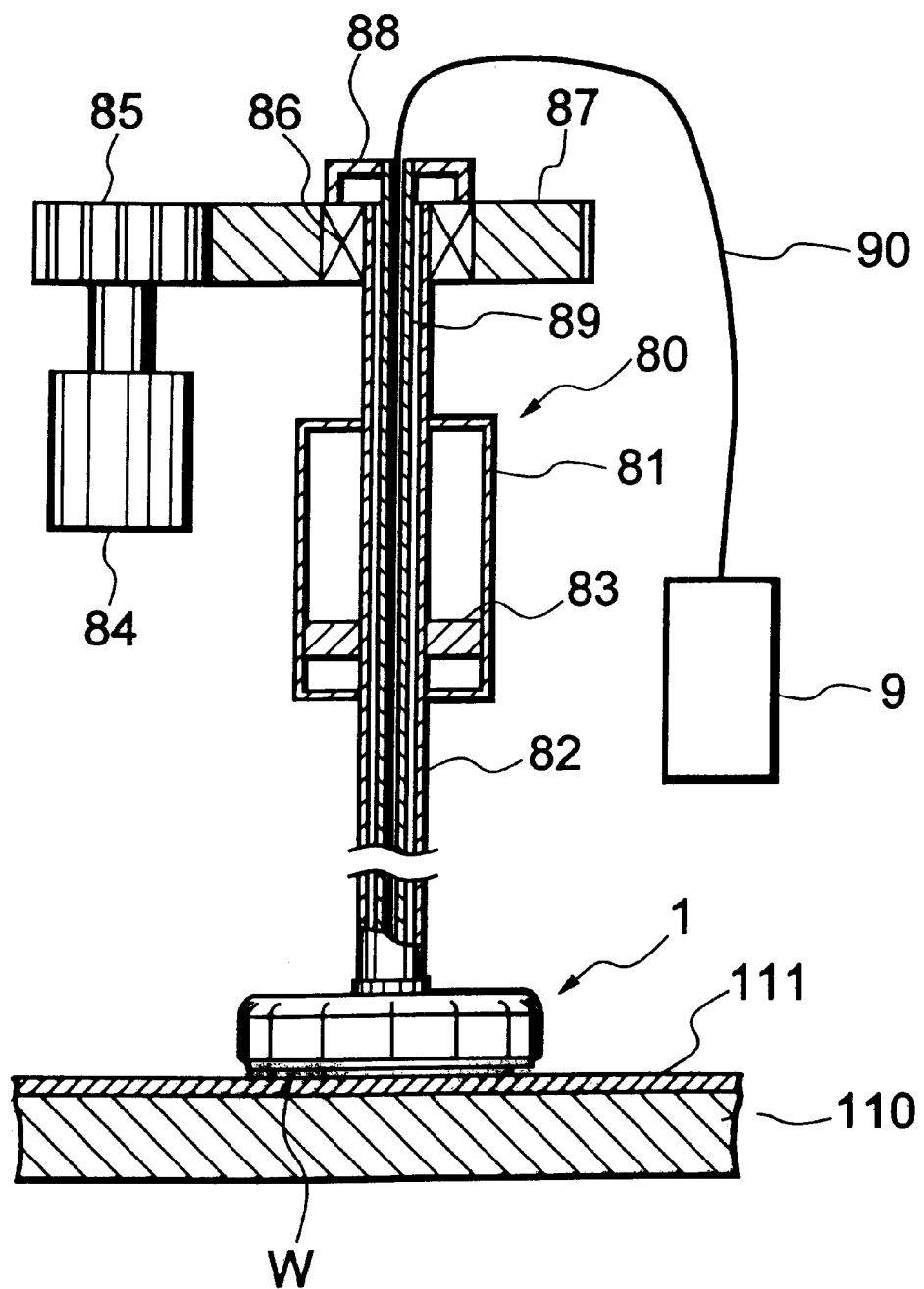
FIG. 2 is a sectional view of the structure of a rotary drive mechanism.

FIG. 2 is a sectional view of the rotary drive mechanism 8.

As shown in FIG. 2, the cylinder 80 is comprised of a piston rod 82 passing through a cylinder body 81 and a piston 83 air-tightly fitting in the cylinder body 81 in a state affixed to the outer side of the piston rod 82.

Due to this, by adjusting the air pressure in the cylinder body 81, it is possible to make the piston rod 82 move up and down integrally with the piston 83 and adjust the pressing force on the carrier 1.

On the other hand, the motor 84 is linked with the piston rod 82 of the cylinder 80. That is, a gear 85 of the shaft of the motor 84 is engaged with a gear 87 attached through a bearing 86 at the upper portion of the piston rod 82. The upper end of the cylindrical inner rod 89 is affixed to a support member 88 affixed to the upper surface of the gear 87.

Due to this, when the motor 84 is driven, the rotation is transmitted to the inner rod 89 through the gears 85 and 87 and the support member 88 and the inner rod 89 rotates at a predetermined speed in the piston rod 82.

The carrier 1 is structured to be able to rotate in a state where the wafer W on the polishing pad 111 of the platen 110 is held and is attached to the lower end portion of the piston rod 82.

Figure 3:
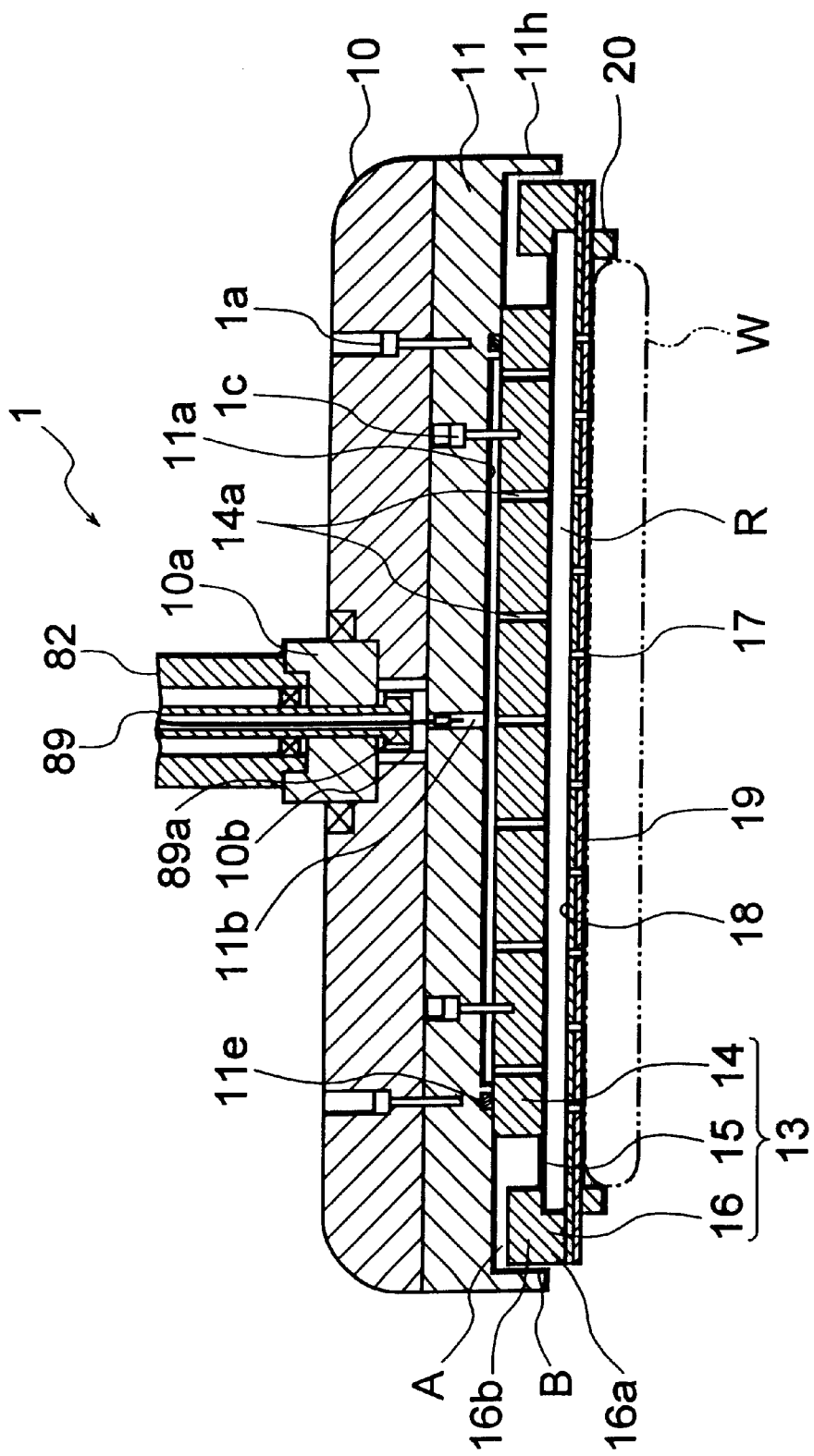
FIG. 3 is a sectional view of the structure of a carrier.
Figure 4:
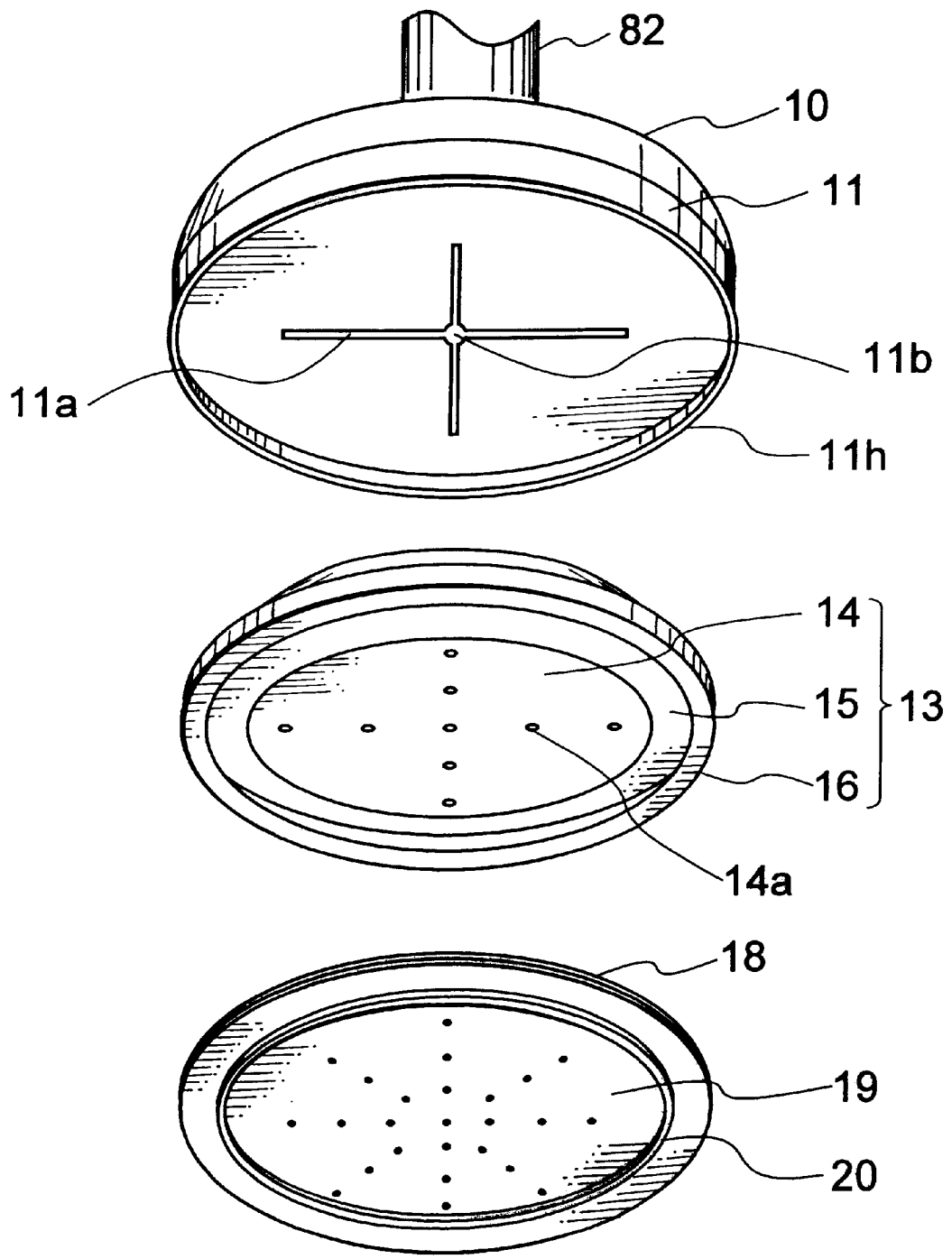
FIG. 4 is a disassembled perspective view of the carrier.

FIG. 3 is a sectional view of the structure of the carrier 1, while FIG. 4 is a disassembled perspective view of the same.

As shown in FIG. 3 and FIG. 4, the carrier 1 is provided with a housing 10, a carrier base 11, a sheet supporter 13, a hard sheet 18, a soft backing sheet 19, and a collar 20 as a ring-shaped member.

The housing 10, as shown in FIG. 3, has a rotatable connecting member 10a at its center portion. The lower end portion of the piston rod 82 is connected to this connecting member 10a. Further, this housing 10 has an internal gear 10b at the bottom side of the connecting member 10a. The internal gear 10b engages with an external gear 89a formed at the lower end side of the inner rod 89 passing through a center hole of the connecting member 10a.

Due to this, when the inner rod 89 rotates by being driven by the motor 84, the rotational force of the motor 84 is transmitted to the housing 10 by the engagement of the internal gear 10b and the external gear 89a.

The carrier base 11 is affixed by screws 1a to the bottom surface of the housing 10. A plurality of grooves 11a are formed in its bottom surface. At the intersections of these grooves 11a are formed air exits/inlets 11b allowing the exit and entry of air from the previously mentioned air pump 9. Further, a guard 11h is formed at the outer periphery of the bottom surface of the carrier base 11.

The sheet supporter 13 is formed from a material such as polyvinyl chloride (PVC) and, as shown in FIG. 3, is affixed to the bottom surface of the carrier base 11 by screws 1c.

The sheet supporter 13 is formed by a supporter body 14 (body portion), diaphragm 15 (diaphragm portion), and edge ring 16 (edge portion).

Specifically, the supporter body 14 forms a disk shape and is directly affixed to the bottom surface of the carrier base 11 by screws 1c. Further, a plurality of holes 14a (fluid circulation holes) formed in the supporter body 14 are communicated through the grooves 11a with the air exit/inlets 11b. Further, an O-ring 11e is fitted to the outside of the grooves 11a. Due to this O-ring lie, the air-tightness between the carrier base 11 and the supporter body 14 is held and the air inside the grooves 11a is prevented from leaking outside.

The diaphragm 15 extends outward substantially horizontally from the lower end of the outer peripheral surface-of the supporter body 14 and forms a ring shape overall. The thickness of this diaphragm 15 is set to a value in the range of for example 0.5 mm to 2.0 mm. The diaphragm 15 can flex up and down.

The edge ring 16 is formed in a ring shape along the outer edge portion of the diaphragm 15 and is comprised of an upper projecting portion 16b and a lower projecting portion 16a projecting in the upward and downward directions. The lower projecting portion 16a is positioned at the outside of the wafer W. That is, the inner diameter of the lower projecting portion 16a is set to be larger than the outer diameter of the wafer W. As opposed to this, the inner diameter of the upper projecting portion 16b is set substantially equal to the outer diameter of the wafer W. Further, the upper surface of the upper projecting portion 16b is positioned exactly a predetermined distance down from the bottom, surface of the carrier base 11 in the initial state and forms a gap A between the upper surface of the upper projecting portion 16b and the bottom surface of the carrier base 11. The outer diameter of the edge ring 16 is set smaller than the inner diameter of the guard 11h of the carrier base 11. A gap B is formed between the outer peripheral surface of the edge ring 16 and the inner peripheral surface of the guard 11h.

The hard sheet 18 is formed by a fusible material such as polyvinyl chloride, polyethylene, polyacrylate, and polycarbonate. The soft backing sheet 19 is formed by a soft material such as a silicone rubber, polyurethane foam, fluororubber, and nitrile rubber.

The hard sheet 18 and the soft backing sheet 19 are bonded together in the state with the hard sheet 18 at the top. They form a circular shape with a diameter substantially equal to that of the lower projecting portion 16a of the edge ring 16.

Further, the outer peripheral portion of the upper hard sheet 18 is affixed air-tightly by a nonsoluble adhesive or soluble adhesive to the bottom surface of the lower projecting portion 16a of the edge ring 16.

Due to this, a pressure chamber R communicating with the through holes 14a of the supporter body 14 is defined between the hard sheet 18 and the sheet supporter 13. When the soft backing sheet 19 contacts the wafer W, the hard sheet 18 and the soft backing sheet 19 flex molding against the warping, undulation, etc. of the wafer W.

Note that reference numeral 17 indicates wafer suction holes passing through the hard sheet 18 and the soft backing sheet 19.

The collar 20 is a member for holding the wafer W. The outer diameter of the collar 20 is set substantially equal to the inner diameter of the lower projecting portion 16a of the edge ring 16, while the inner diameter of the collar 20 is set substantially equal to the outer diameter of the wafer W. Further, the outer peripheral surface of the collar 20 is bonded to the lower surface of the soft backing sheet 19 so as to substantially match the inner peripheral surface of the lower projecting portion 16a. The thickness of the collar 20 is set to not more than ½ of the thickness of the wafer W and holds the upper portion of the outer peripheral surface of the wafer W.

On the other hand, the air pump 9 shown in FIG. 1 and FIG. 2 supplies air of a desired pressure into the above pressure chamber R of the carrier 1 to make the inside of the pressure chamber R a positive pressure or sucks air inside of the pressure chamber R out to make the inside of the pressure chamber R a negative pressure. Specifically, an air hose 90 is inserted through the inner rod 89 and, as shown in FIG. 3, has a front end portion fit into the air exit/inlet 11b of the carrier base 11.

Next, an explanation will be given of the operation of the CMP apparatus of this embodiment.

Figure 5:
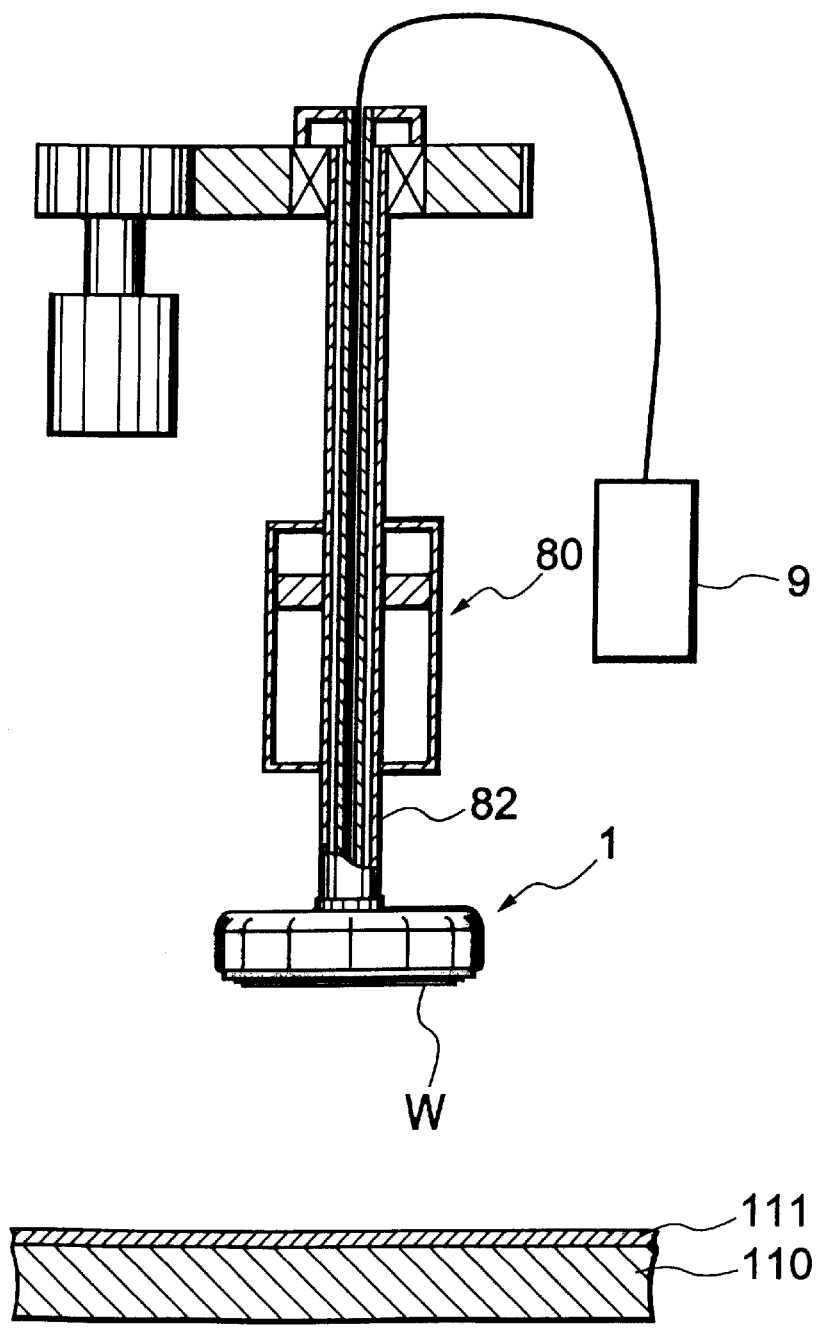
FIG. 5 is a front view of the state of wafer suction.

The wafer W is held by the carrier 1 and conveyed on the polishing pad 111 of the platen 110, as shown in FIG. 5, by driving the air pump 9 to suck air in a state with the wafer W brought into contact against the bottom surface of the soft backing sheet 19 (see FIG. 3).

This being so, the air in the pressure chamber R and the suction holes 17 of the carrier 1 shown in FIG. 3 is sucked out through the air hose 90. The inside of the pressure chamber R becomes a negative pressure and the wafer W is sucked against the soft backing sheet 19 through the suction holes 17.

In this state, the cylinder 80 is driven and the piston rod 82 is made to descend until the wafer W contacts the polishing pad 111, then the wafer W is pressed against the polishing pad 111 by a predetermined pressing force F.

Suitably thereafter, the air pump 9 is driven to supply air, air is sent from the air hose 90 to the inside of the pressure chamber R, and the inside of the pressure chamber R is made a positive pressure.

Figure 6:
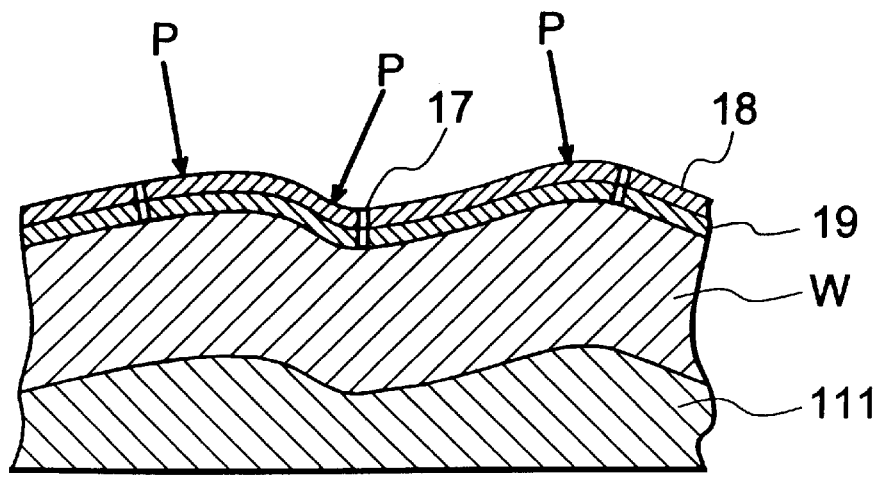
FIG. 6 is a sectional view of the state of the hard sheet and soft backing sheet molding against the unevenness of the wafer.

This being done, as shown in FIG. 6, the hard sheet 18, soft sheet 19, and polishing pad 111 deform molding against the unevenness etc. of the wafer W, a uniform air pressure P is applied over substantially the entire upper surface of the wafer W, and the polishing pad 111 molds against the unevenness etc. of the lower surface of the wafer W.

In this state, if the motors 84 and 112 shown in FIG. 1 are driven and the carrier 1 and platen 110 are made to rotate in mutually opposite directions while supplying a not shown polishing solution, the bottom surface of the wafer W is polished by the rotating polishing pad 111.

At the time of this polishing, the pressing force F applied to the carrier 1 by the cylinder 80 is applied to the sheet supporter 13 and is applied through the air in the pressure chamber R to the hard sheet 18 and the soft backing sheet 19.

Figure 16:
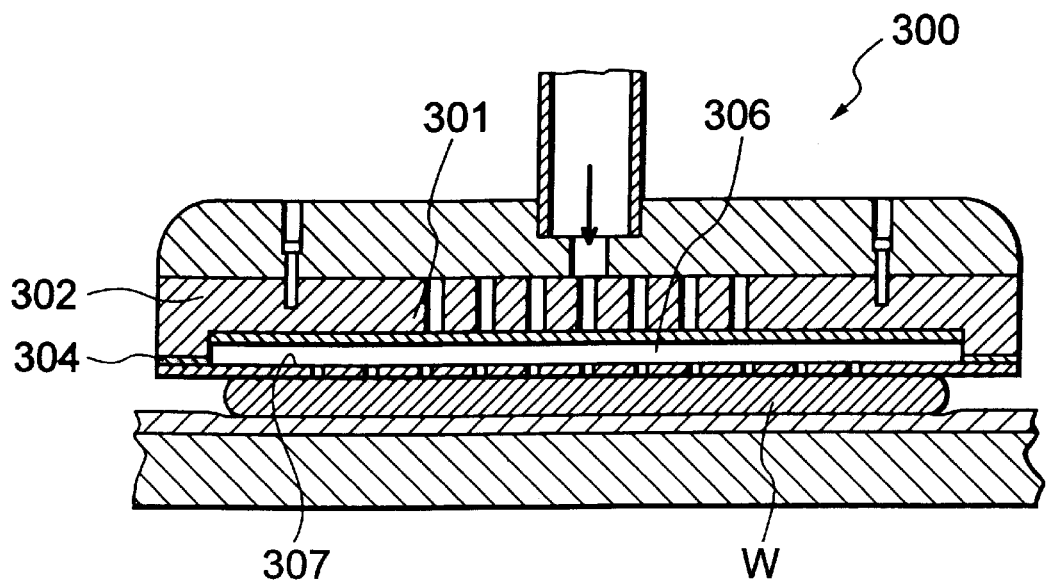
FIG. 16 is a sectional view of a carrier of an air-pressurizing type CMP apparatus of the related art.
Figure 17:
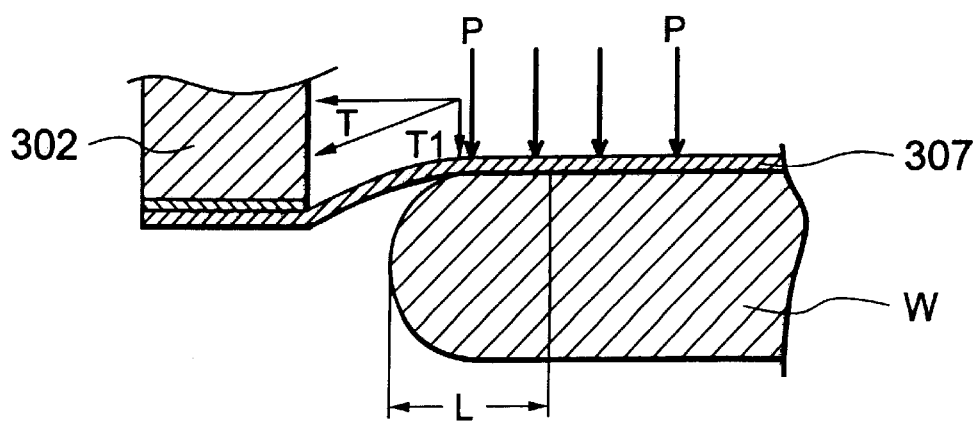
FIG. 17 is an enlarged sectional view of the state of over polishing.

Therefore, if the edge ring 16 is directly connected to the supporter body 14 like the conventional carrier 300 shown in FIG. 16, as shown in FIG. 17, the edge ring 16 pulls the outer peripheral portion of the hard sheet 18 downward and the polishing rate of the outer peripheral portion of the wafer W ends up becoming higher.

Figure 7:
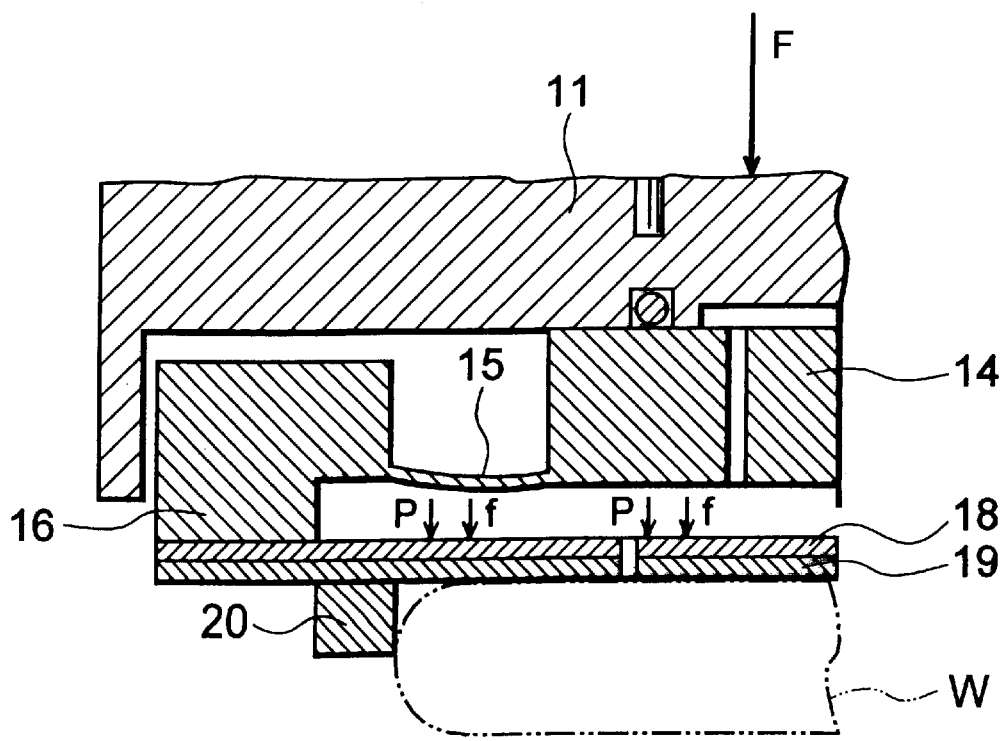
FIG. 7 is a partial enlarged sectional view of the state of flexing of the diaphragm.

In the carrier 1 of the CMP apparatus of this embodiment, however, since the edge ring 16 is connected through the pliable diaphragm 15 to the supporter body 14, as shown in FIG. 7, at the time of pressing of the carrier 1, the upward resistance from the hard sheet 18 is applied to the edge ring 16 and at the same time the diaphragm 15 flexes upward. Accordingly, the outer peripheral portion of the hard sheet 18 will never be pulled downward, though it might be pulled upward. Therefore, no downward tension occurs at the outer peripheral portion of the hard sheet 18 and uniform air pressure P and component force f of the pressing force F act on the outer peripheral portion of the wafer W in the same way as at the center portion. As a result, uniform polishing of the entire surface of the wafer W, including the outer peripheral portion of the wafer W, becomes possible.

When there is unevenness in the surface of the polishing pad ill of the platen 110, however, the carrier 1 will sometimes incline somewhat in accordance with that unevenness.

Figure 8:
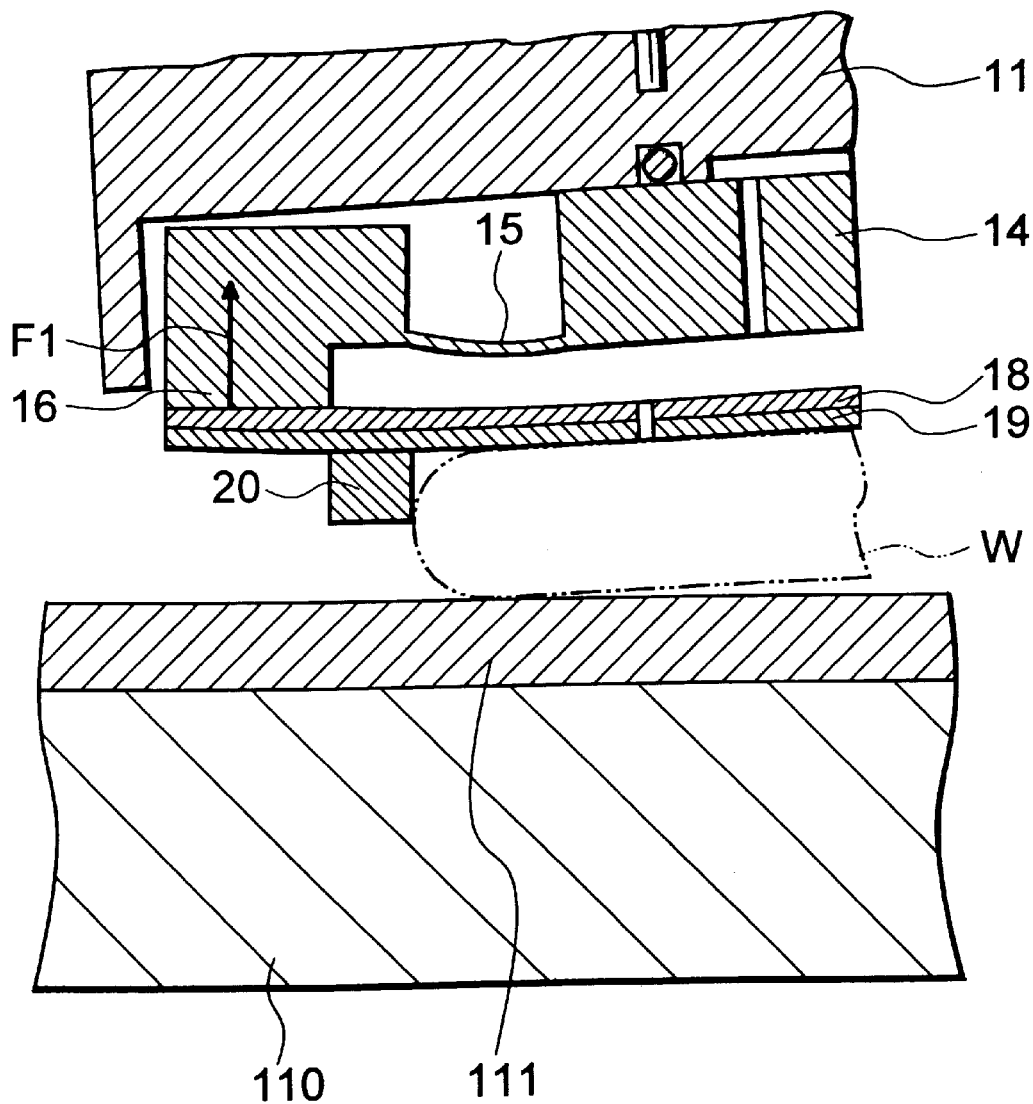
FIG. 8 is a partial enlarged sectional view of the state of flexing of the diaphragm when the carrier is inclined.

At this time, as shown in FIG. 8, the large resistance F1 will act at the lowered portion of the edge ring 16, but in this case as well, the diaphragm 15 will flex and the resistance F1 will be relieved, so the polishing rate of the outer peripheral portion of the wafer W will not become higher.

Further, even if the carrier inclines somewhat, since the wafer is held by the collar 20 from the outside, it will not jump out to the outside of the carrier 1.

Further, since the diaphragm 15 and the hard sheet 18 are pliable, if the pressure P in the pressure chamber R rises, the diaphragm 15 and the hard sheet 18 will both warp upward and the force applied to the outer peripheral portion of the wafer W will become smaller.

Accordingly, it is possible to adjust the polishing rate of the outer peripheral portion of the wafer W by controlling the air pressure P in the pressure chamber R.

(Second Embodiment)

Figure 9:
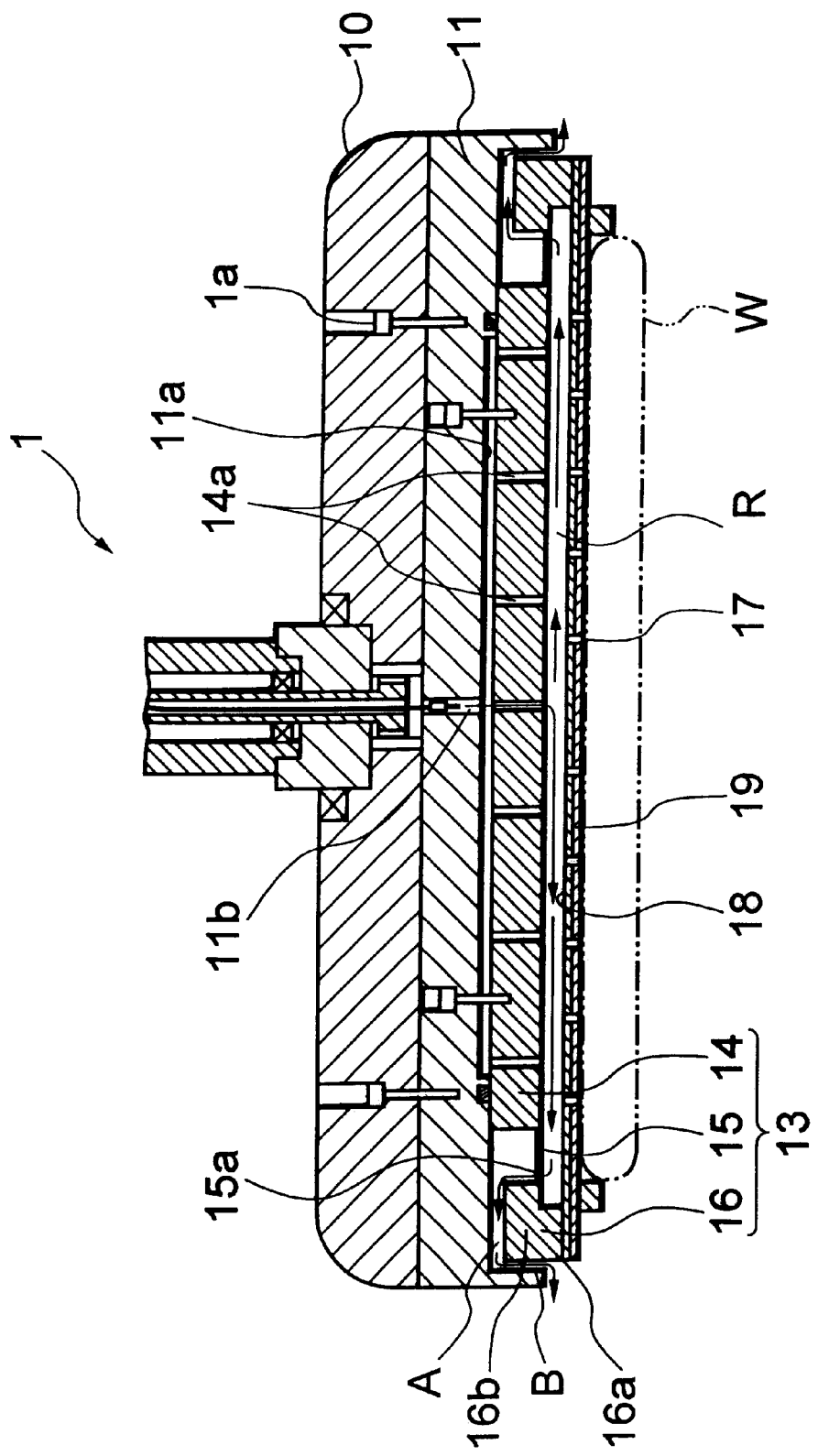
FIG. 9 is a sectional view of a carrier of a CMP apparatus according to a second embodiment of the present invention.

FIG. 9 is a sectional view of a carrier of a CMP apparatus according to a second embodiment of the present invention and is a partial enlarged sectional view of the essential portions.

This embodiment differs from the above first embodiment in the point that holes 15a are made in the diaphragm 15 of the sheet supporter 13.

In the carrier 1 shown in FIG. 3, if air continues to be supplied inside the air-tight pressure chamber R, since the carrier 1 is rotating at a high speed, the air in the pressure chamber R will move to the outer peripheral portion side of the pressure chamber R due to the centrifugal force and the air density at the outer peripheral portion of the pressure chamber R may become higher or turbulence will occur in the outer peripheral portion and the air pressure P applied to the outer peripheral portion of the hard sheet 18 may become higher than the other portions.

Figure 10:
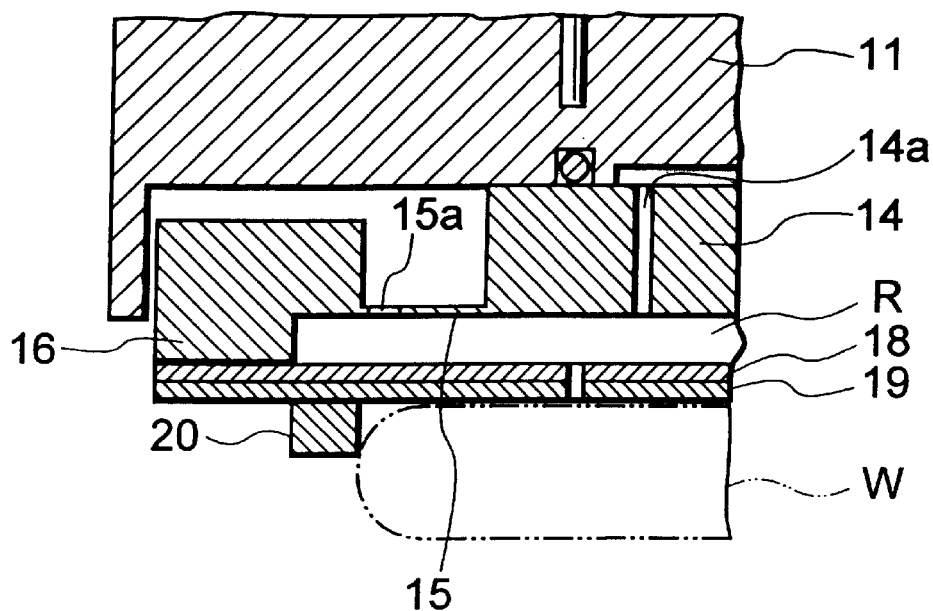
FIG. 10 is a partial enlarged sectional view of the waist portion of the carrier shown in FIG. 9.

Therefore, in this embodiment, as shown in FIG. 10, holes 15a are made in diaphragm 15 at locations near the edge ring 16.

Due to this, the air supplied inside the pressure chamber R, as shown by the arrows in FIG. 9, flows toward the outer peripheral portion side of the pressure chamber R and flows out from the holes 15a through the gaps A and B to the outside of the carrier 1. Therefore, the air density in the pressure chamber R becomes uniform because a stable air circulation route of a substantially laminar state air is formed in the pressure chamber R. As a result, the air pressure P is applied uniformly over the entire surface of the hard sheet 18.

Therefore, according to this embodiment, it is possible to make the distribution of the air pressure P in the pressure chamber R reliably uniform and possible to further improve the uniformity of polish of the wafer W.

The rest of the configuration and the mode of operation and advantageous effects are similar to those of the first embodiment explained above, so explanations thereof will be omitted.

Note that the present invention is not limited to the above embodiments and include various modifications and changes within the scope of the gist of the invention.

For example, in the above embodiments, air was used as the fluid, but it is also possible to use a liquid such as oil and press uniformly against the wafer W by oil pressure etc.

Figure 11:
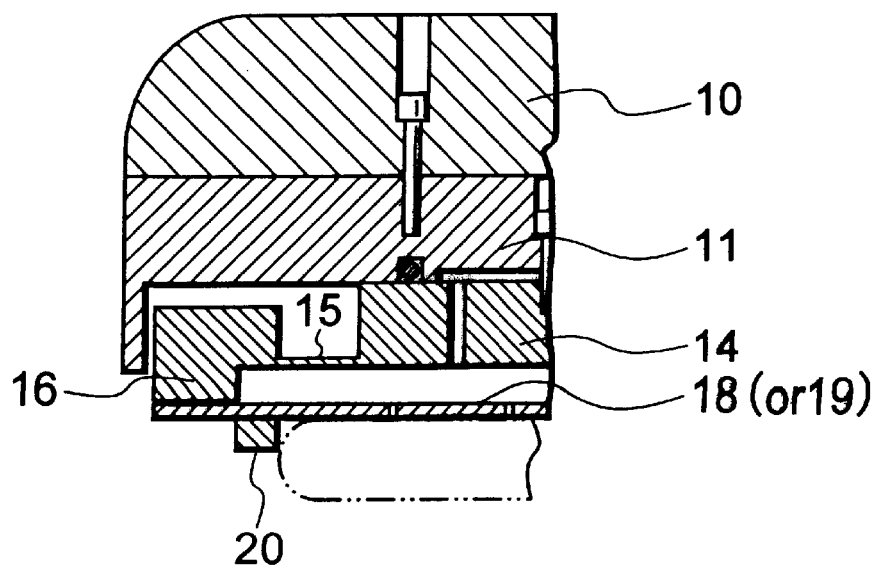
FIG. 11 is a sectional view of a first modification of the embodiment.

Further, in the above embodiments, as the pliable sheet, a double-layer structure sheet comprised of the hard sheet 18 and the soft backing sheet 19 was used, but as shown in FIG. 11, it is also possible to arrange either of the hard sheet 18 or soft backing sheet 19 at the bottom surface of the edge ring 16 and affix the outer peripheral portion of the upper surface of the sheet air-tightly to the edge ring 16 by a nonsoluble adhesive or soluble adhesive.

Figure 12:
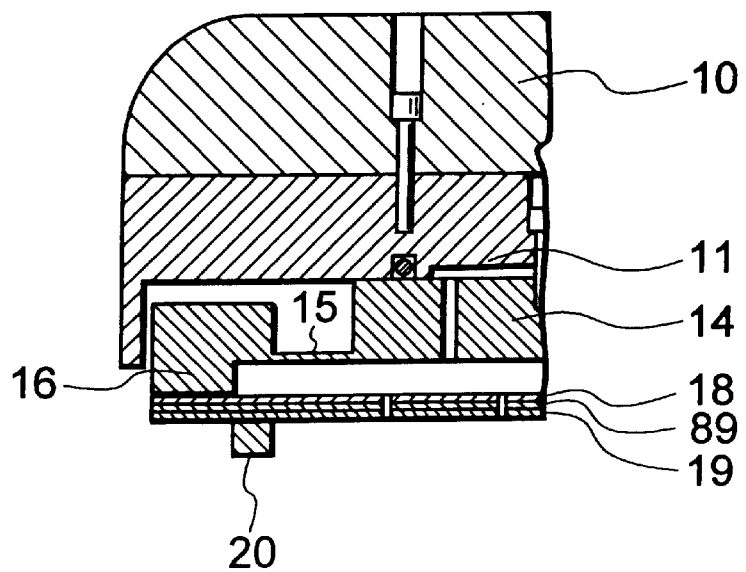
FIG. 12 is a sectional view of a second modification of the embodiment.

Further, as shown in FIG. 12, the hard sheet 18 and the soft backing sheet 19 are adhered together by an intermediate sheet 89 such as a double-sided adhesive tape and the outer peripheral portion of the upper surface of the hard sheet 18 is affixed air-tightly to the edge ring 16 by a nonsoluble adhesive or soluble adhesive.

Further, in the above embodiments, the inner diameter of the lower projecting portion 16a of the edge ring 16 was set larger than the outer diameter of the wafer W, but it may be set to be substantially equal as well.

Figure 13:
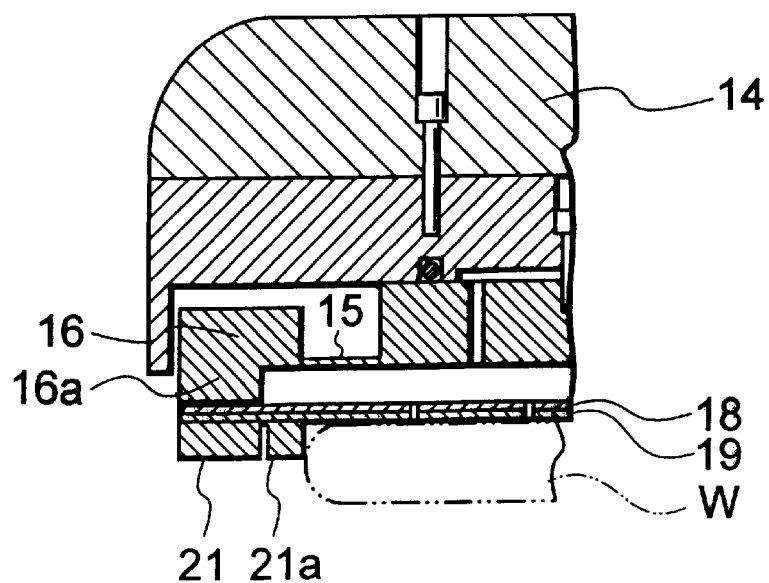
FIG. 13 is a sectional view of a third modification of the embodiment.

Further, in the above embodiments, the width of the collar 20 was set to be substantially equal to the distance between the inner peripheral surface of the lower projecting portion 16a of the edge ring 16 and the outer peripheral surface of the wafer W, but as shown in FIG. 13, it is also possible to affix the wide width collar 21 extending from the outer peripheral surface of the wafer W to the outer peripheral surface of the edge ring 16 to the bottom surface of the soft backing sheet 19. Note that in this case, as shown in the figure, it is preferable to form notches 21a at corresponding locations at the inner peripheral surface of the lower projecting portion 16a so that the diaphragm 15 can easily flex.

Figure 14:
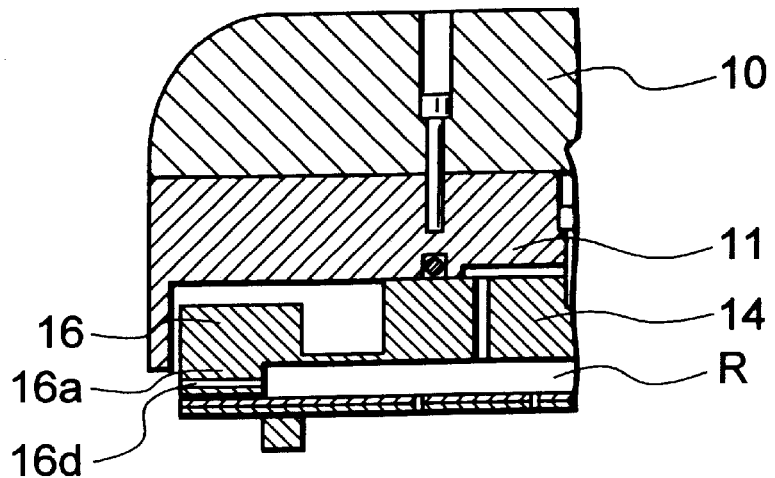
FIG. 14 is a sectional view of a fourth modification of the embodiment.
Figure 15:
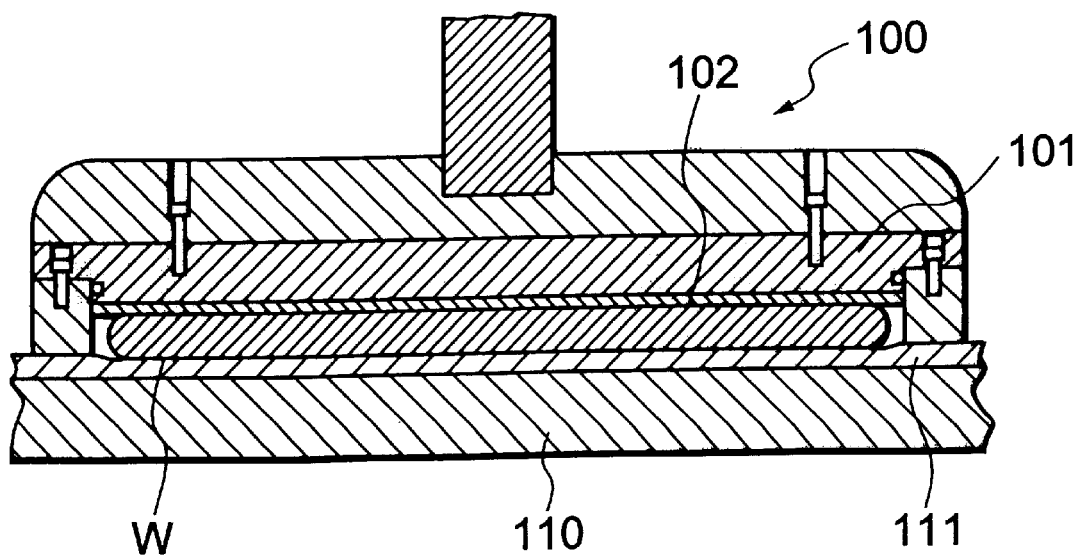
FIG. 15 is a sectional view of the carrier of a general CMP apparatus.

Further, in the above second embodiment, air relief holes 15a were formed in the diaphragm 15, but as shown in FIG. 14, substantially the same advantageous effects can be obtained by making through holes 16d communicating the pressure chamber R and the outside of the carrier 1 at the bottom portion of the lower projecting portion 16a of the edge ring 16.

As explained above in detail, according to the aspects of the invention, since the pliable diaphragm portion flexes and the pressing force applied to the edge portion is relieved when pressing the carrier, it is possible to prevent occurrence of downward tension on the outer peripheral portion of the sheet. As a result, it is possible to apply fluid pressure uniformly across the entire surface of the workpiece, including the outer peripheral portion, so there is the advantageous effect that it is possible to improve the uniformity of polish of the workpiece. Further, since the workpiece is surrounded by a ring-shaped member, it is possible to prevent the workpiece from jumping out when the carrier is rotating.

Further, according to the aspects of the invention, since it is possible to stabilize the flow of fluid in the pressure chamber, it is possible to further improve the uniformity of the distribution of pressure and as a result to further improve the uniformity of polish of the workpiece.

What is claimed is:

1. A carrier comprising:

a disk-shaped body portion having fluid circulation holes;

a pliable ring-shaped diaphragm portion expanding outward from the outer peripheral surface of said body portion;

a ring-shaped portion projecting at least downward from an outer edge portion of said diaphragm portion and having an inner diameter of at least an outer diameter of a workpiece;

a pliable double layer sheet having an outer peripheral portion on an upper surface thereof affixed air-tightly to a bottom end portion of said outer edge portion, the back surface of said pliable double layer sheet defining a single pressure chamber communicating with the fluid circulation holes, wherein said pliable double layer sheet is formed by a single hard sheet and soft sheet bonded together; and a ring-shaped member, for surrounding the workpiece, affixed to the bottom surface of said sheet.

2. A carrier as set forth in claim 1, wherein said outer edge portion includes through holes providing communication between the pressure chamber and the atmosphere.

3. A carrier as set forth in claim 1, wherein said diaphragm portion includes holes providing communication between the pressure chamber and the atmosphere, said holes being located near the outer edge portion.

4. A carrier comprising:

a disc-shaped body portion having fluid circulation holes;

a pliable ring-shaped diaphragm portion expanding outward from the outer peripheral surface of said body portion;

a ring-shaped edge portion projecting at least downward from an outer edge portion of said diaphragm portion and having an inner diameter of at least an outer diameter of a workpiece;

a pliable double layer sheet having an outer peripheral portion on an upper surface thereof affixed air-tightly to a bottom end portion of said outer edge portion, the back surface of said pliable double layer sheet defining a single pressure chamber communicating with the fluid circulation holes, wherein said pliable double layer sheet is formed by a single hard sheet and a soft sheet bonded to a bottom surface of said hard sheet; and a ring-shaped member, for surrounding the workpiece, affixed to the bottom surface of said sheet.

5. A carrier as set forth in claim 4, wherein said hard sheet and said soft sheet are adhered to one another through an intermediate sheet having an adhesive on upper and lower surfaces of said intermediate sheet.

* * * * *

UNITED STATES PATENT AND TRADEMARK OFFICE
CERTIFICATE OF CORRECTION

PATENT NO. : 6,210,260 B1
DATED : April 3, 2001
INVENTOR(S) : Tanaka Hideo, Wang Xu-Jin, Sugiyama Misuo, Tanaka Kei, Ishida Makoto, Hakomori Shunji It is certified that error appears in the above-identified patent and that said Letters Patent is hereby corrected as shown below:

<u>Title page,</u>
Item [56], References Cited, U.S. PATENT DOCUMENTS
Please replace "5,449,216* 9/1995 Strasbaugh.......451/388" with
-- 5,449,316* 9/1995 Strasbaugh..............451/388 --

Signed and Sealed this

Second Day of October, 2001

Attest:

NICHOLAS P. GODICI
Attesting Officer    Acting Director of the United States Patent and Trademark Office